(12) United States Patent
Delshadpour et al.

(10) Patent No.: US 11,378,600 B2
(45) Date of Patent: Jul. 5, 2022

(54) SQUELCH AND DISCONNECT DETECTOR

(71) Applicant: NXP B.V., Eindhoven (NL)

(72) Inventors: Siamak Delshadpour, Phoenix, AZ (US); Ranjeet Kumar Gupta, Chandler, AZ (US); Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 69 days.

(21) Appl. No.: 16/933,643

(22) Filed: Jul. 20, 2020

(65) Prior Publication Data
US 2022/0018881 A1    Jan. 20, 2022

(51) Int. Cl.
*G01R 19/165* (2006.01)
*G06F 13/42* (2006.01)
*H04B 1/16* (2006.01)
*H03H 7/00* (2006.01)

(52) U.S. Cl.
CPC ... *G01R 19/16533* (2013.01); *G06F 13/4282* (2013.01); *H04B 1/16* (2013.01); *G06F 2213/0042* (2013.01); *H03H 7/00* (2013.01)

(58) Field of Classification Search
None
See application file for complete search history.

(56) References Cited

U.S. PATENT DOCUMENTS

| | | | |
|---|---|---|---|
| 9,606,955 B2 * | 3/2017 | Chen | G06F 13/4291 |
| 9,729,132 B1 * | 8/2017 | Zhang | H03K 5/2481 |
| 10,083,147 B2 | 9/2018 | Srivastava | |
| 10,429,874 B1 | 10/2019 | Delshadpour et al. | |
| 11,165,610 B1 * | 11/2021 | Delshadpour | H04L 25/03885 |
| 2002/0142743 A1 * | 10/2002 | Yu | G06F 13/4072 455/222 |
| 2012/0311359 A1 * | 12/2012 | Jaramillo | H04L 25/0298 713/321 |
| 2014/0006654 A1 * | 1/2014 | Chan | G06F 13/385 710/16 |
| 2014/0006655 A1 * | 1/2014 | Chan | G06F 1/3209 710/16 |
| 2014/0006674 A1 * | 1/2014 | Chan | G06F 13/4221 710/313 |
| 2014/0149609 A1 | 5/2014 | Chan et al. | |
| 2014/0173166 A1 * | 6/2014 | Chen | G06F 1/3253 710/316 |

(Continued)

FOREIGN PATENT DOCUMENTS

| | | | | |
|---|---|---|---|---|
| CN | 110309092 A | * | 10/2019 | G06F 11/221 |
| WO | WO-0148613 A2 | * | 7/2001 | G06F 13/4086 |
| WO | WO-2017112065 A1 | * | 6/2017 | G06F 13/4068 |

*Primary Examiner* — Menatoallah Youssef
*Assistant Examiner* — Khareem E Almo

(57) ABSTRACT

A circuit is disclosed. The circuit includes an input port, an output port, a squelch detector and a disconnect detector. The squelch detector and the disconnect detector are enabled or disabled by a signal such that only one of the squelch detector and the disconnect detector is active at a given time. When the squelch detector is active, a threshold generator generates a squelch threshold for the squelch detector based on a squelch configuration data indicative of a predefined squelch threshold. When the disconnect detector is active, the threshold generator generates a disconnect threshold for the disconnect detector based on a disconnect configuration data indicative of a predefined disconnect threshold.

19 Claims, 3 Drawing Sheets

(56) References Cited

U.S. PATENT DOCUMENTS

| | | | |
|---|---|---|---|
| 2016/0162427 A1* | 6/2016 | Kang | G06F 13/387 |
| | | | 710/313 |
| 2017/0168979 A1* | 6/2017 | Remple | G06F 13/4068 |
| 2019/0004590 A1* | 1/2019 | Srivastava | G06F 13/4022 |
| 2020/0042488 A1 | 2/2020 | Maung et al. | |
| 2020/0073839 A1 | 3/2020 | Maung et al. | |

* cited by examiner

SQUELCH AND DISCONNECT DETECTOR

BACKGROUND

Universal Serial Bus (USB) devices that communicate with a host over USB include USB printers, scanners, digital cameras, storage devices, card readers, and the like. USB based systems may require that a USB host controller be present in the host system, and that the operating system (OS) of the host system support USB and USB Mass Storage Class Devices. USB2 devices may communicate over the USB bus at low speed (LS), full speed (FS), or high speed (HS). A connection between a USB device and a host may be established via a four wire interface that includes a power line, a ground line, and a pair of data line, differential voltage plus (D+) and differential voltage minus (D−), or for the case of USB On-The-Go (OTG), a fifth line named ID (identification pin) may be added. When a USB device connects to the host, the USB device may first pull a D+ line high (or the D− line if the device is a low speed device) using a pull up resistor on the D+ line when connecting as FS (Full Speed) mode. The host may respond by resetting the USB device. If the USB device is a high-speed USB device, the USB device may "chirp" by driving the D− line high during the reset. The host may respond to the "chirp" by alternately driving the D+ and D− lines high. The USB device may then electronically remove the pull up resistor and continue communicating at high speed if both communicating devices are HS capable. Disconnection at high-speed happens when a cable is removed and HS RX terminal on USB device is removed. It results in doubling HS amplitude on the USB host transmitter. The USB2 specification defines a mechanism to detect differential line voltage using differential difference receiver detectors.

The success of USB2.0 technology has enjoyed wide adoption in almost every computing device, with tremendous ecosystem support not only in terms of device choice to support various platform features, but also in terms of technology development with well-established hardware IP portfolios and standardized software infrastructure. It is foreseeable that the great asset of USB2.0 technology will continue to benefit the ecosystem for years to come. As power efficiency becomes increasingly critical in today's computing devices, there is a need for IO technology to be optimized for both active and idle power. USB2.0 technology, originally optimized for external device interconnect, is primed to be enhanced for inter-chip interconnect such that the link power can be further optimized. Meantime, silicon technology continues to scale. Device dimensions are getting smaller and therefore more devices can be packed onto a single integrated chip. However, the device reliability challenge arising from the densely packed transistors has become more profound. The manufacturing cost for an advanced process technology to support 3.3V IO signaling has grown exponentially. A low voltage USB2.0 solution is therefore required to address the gap. Embedded USB is a newer standard to fill the gap caused due to advance silicon processes.

At system level, eUSB2 to USB2.0 bridge (eUSB2 repeater) is required to support host (SoC) communication to external USB2.0 compliant devices via USB connectors. eUSB2/USB2 and USB2/USB2 repeaters require both squelch detector (SQD) and disconnect detector (DCD) at USB2.0 connector port for highspeed (HS) communication (SQD and DCD for USB2 port and SQD for eUSB port). Each of the SQD and DCD work at 480 Mbps range, but support different functionalities. The invention describes method to combine squelch detector and disconnect detector in an eUSB2 or USB2 repeater.

SUMMARY

In one embodiment, a circuit is disclosed. The circuit includes an input port, an output port, a squelch detector and a disconnect detector. The squelch detector and the disconnect detector are enabled or disabled by a signal such that only one of the squelch detector and the disconnect detector is active at a given time. When the squelch detector is active, a threshold generator generates a squelch threshold for the squelch detector based on a squelch configuration data indicative of a predefined squelch threshold. When the disconnect detector is active, the threshold generator generates a disconnect threshold for the disconnect detector based on a disconnect configuration data indicative of a predefined disconnect threshold.

The circuit may include a mapping table to map the squelch configuration data and the disconnect configuration data and corresponding predefined thresholds. The mapping table may be implemented using a digital to analog converter with a input to output calibration according to the mapping table.

In some examples, the circuit may include a RC network coupled with the input port, wherein the RC network includes a first resistor $R_1$ and a first capacitor $C_1$, a second resistor $R_2$ and a second capacitor $C_2$. The second capacitor $C_2$ is one or both of a physical capacitor and a parasitic capacitor. The RC network may be configured such that $R_1*C_1$ is substantially equal to $R_2*C_2$.

In some examples, the threshold generator uses a digital to analog converter that is calibrated to output a predefined voltage signal based on the squelch configuration data and the disconnect configuration data.

In some examples, the circuit may be used in a universal serial bus (USB) repeater or a USB transceiver or a universal serial bus (USB) to embedded USB (eUSB) repeater.

The squelch detector is configured to detect a presence of an input signal at the input port and the squelch detector is active during data reception at a repeater and the disconnect detector is configured to detect a disconnection of a receiver and the disconnect detector is active during data transmission from a repeater.

In another embodiment a circuit is disclosed that includes an input port, an output port, a squelch detector, a disconnect detector and an switchable RC network. The squelch detector and the disconnect detector are enabled or disabled by a signal such that only one of the squelch detector and the disconnect detector is active at a given time. When the disconnect detector is active, the switchable RC network is switched to provide a predefined ratio resistor divider between the input and the output of the switchable RC network and when the squelch detector is active, the switchable RC network is bypassed. In some examples, the switchable RC network is coupled with the input port, wherein the RC network includes a first resistor $R_1$ and a first capacitor $C_1$, a second resistor $R_2$ and a second capacitor $C_2$. The second capacitor $C_2$ may be one or both of a physical capacitor and a parasitic capacitor. The switchable RC network includes a first switch and a second switch. The first switch and the second switch are configured to bypass the resistors $R_1$, $R_2$ and the capacitor $C_1$ when the disconnect detector is inactive and the squelch detector is active. The circuit may be used in a universal serial bus (USB) repeater or in a universal serial bus (USB) to embedded USB (eUSB) repeater. The circuit includes a comparator coupled with the input port and a fix reference voltage equal to a default squelch threshold. The comparator uses the same fix reference voltage when the squelch detector is active and when the disconnect detector is active. The input signal to the comparator coupled with the input port may bypass or pass through a resistor divider depending on whether the squelch or disconnect detector is active.

BRIEF DESCRIPTION OF THE DRAWINGS

Throughout the description, similar reference numbers may be used to identify similar elements.

DETAILED DESCRIPTION

Figure 1:
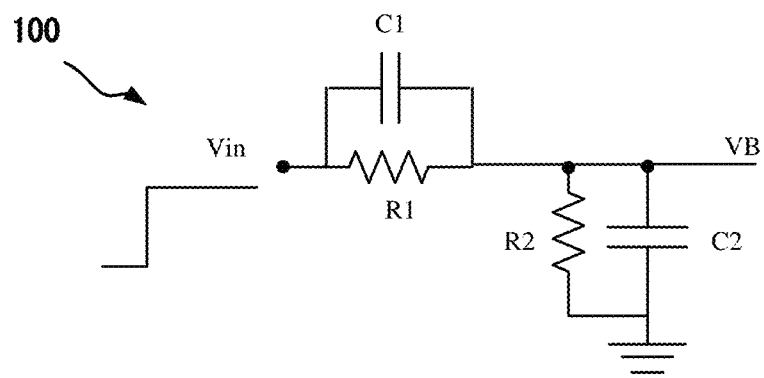
FIG. 1 illustrates a circuit in accordance with example embodiments described herein.

It will be readily understood that the components of the embodiments as generally described herein and illustrated in the appended Figs. could be arranged and designed in a wide variety of different configurations. Thus, the following more detailed description of various embodiments, as represented in the Figs., is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Embodiments herein describe a squelch and disconnect detector for a bi-directional USB repeater. In some examples, the embodiments described herein may also be applicable to unidirectional USB repeaters. Some embodiments use programmable threshold to provide flexible design for different applications. In other examples, a switchable resistor divider may be used for changing the threshold without changing a reference voltage. The example circuits described herein requires less area on silicon compared to a typical squelch detector and a disconnect detector. Power saving is achieved by time multiplexing the two functions (squelch detection and disconnect disconnection) and combining input stage and biasing.

eUSB and USB2 support different levels of signaling. Squelch detector is needed in USB2.0 systems to detect any activity on USB2.0 channels before enabling high-speed receivers. Squelch detector is used to indicate that data is invalid when the amplitude of the differential signal at the receiver's inputs falls below the squelch threshold. It should indicate squelch when the signal drops below 100 mV differential amplitude, and it must indicate that line is not in squelch state when the signal exceeds 150 mV differential amplitude.

When USB2 to eUSB path and USB2 signal receiving is needed, USB2 SQD will be enabled. The repeater will be enabled after detection of incoming signal by USB2 SQD which needs to be detected in a few nanoseconds. At the same time, USB2 DCD may remain off. When the eUSB to USB2 path or USB2 transmission is enabled and signal is passing, USB2 DCD is enabled to detect any disconnect condition while USB2 SQD may be turned off. Disconnect needs to be detected in tens of nano-seconds. Disconnect detector is needed to detect the absence/disconnect/detach of peripheral device when high-speed channel is in active mode. Disconnect detector is required in downstream facing ports to detect the high-speed disconnect state on the line. Disconnection must be indicated when the amplitude of the differential signal at the downstream facing driver's connector is greater than or equal to 625 mV, and it must not be indicated when the signal amplitude is less than or equal to 525 mV. Both of the SDQ and DCD work at 480 Mbps (240 MHz) domain, but they have different detection threshold levels and response time. Normally, SQD has faster response time of 4 nanoseconds (for example) while DCD has a response time of less than 12 to 20 nanoseconds (for example).

FIG. 1 illustrates a circuit 100 that includes a RC network including $R_1$, $C_1$, $R_2$ and $C_2$ to prevent deformation of an input pulse Vin when the pulse is inputted to a processing system (e.g., a SQD) due to a parasitic capacitance ($C_2$) at the input of the processing system. Using a properly tuned RC network, the pulse at the output VB will be substantially the same as the pulse shape at the input Vin. Example embodiments use a small capacitor ($C_1$) in parallel with the resistor $R_1$ (which may be input resistance of the processing system) to increase the input signal rise time. The signal rise time is increased because the small capacitor provides a high frequency path for the input signal. An increase rise time may deliver faster bias voltages to circuits.

Figure 2:
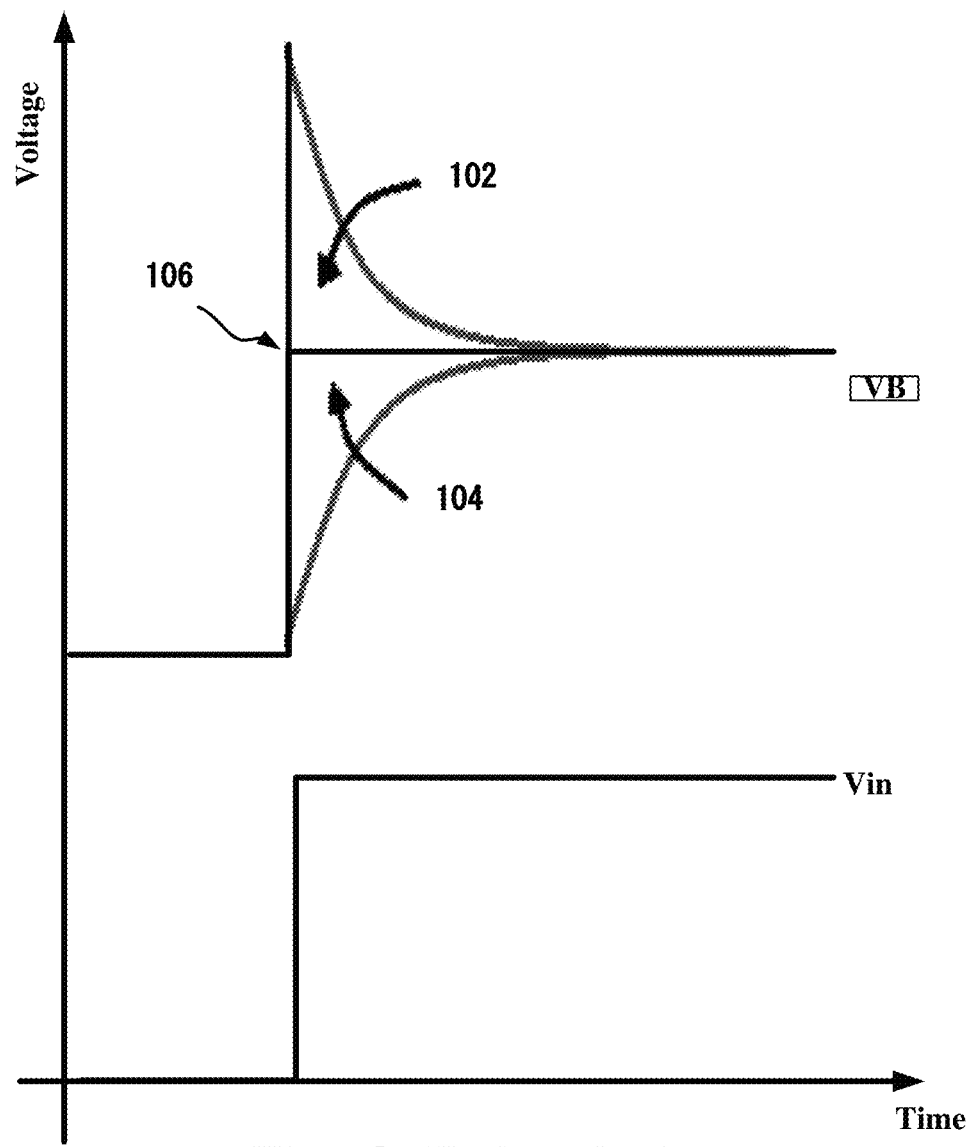
FIG. 2 illustrates voltage jump and settling time relationship in accordance with FIG. 1.

FIG. 2 illustrates voltage jump and settling time relationship in accordance with FIG. 1. If a product of $R_2$ and $C_2$ is greater than $R_1*C_1$, the output voltage VB will deviate from Vin and will have a curved and short settling time, as shown in section 104, from low to high. If $R_2*C_2<R_1*C_1$, the output voltage VB will deviate from Vin and an inverse uneven and short settling time, as shown in the section 102. Ideally, $R_1*C_1=R_2*C_2$, and the output VB will follow the input Vin, as shown by the curve point 106.

Figure 3:
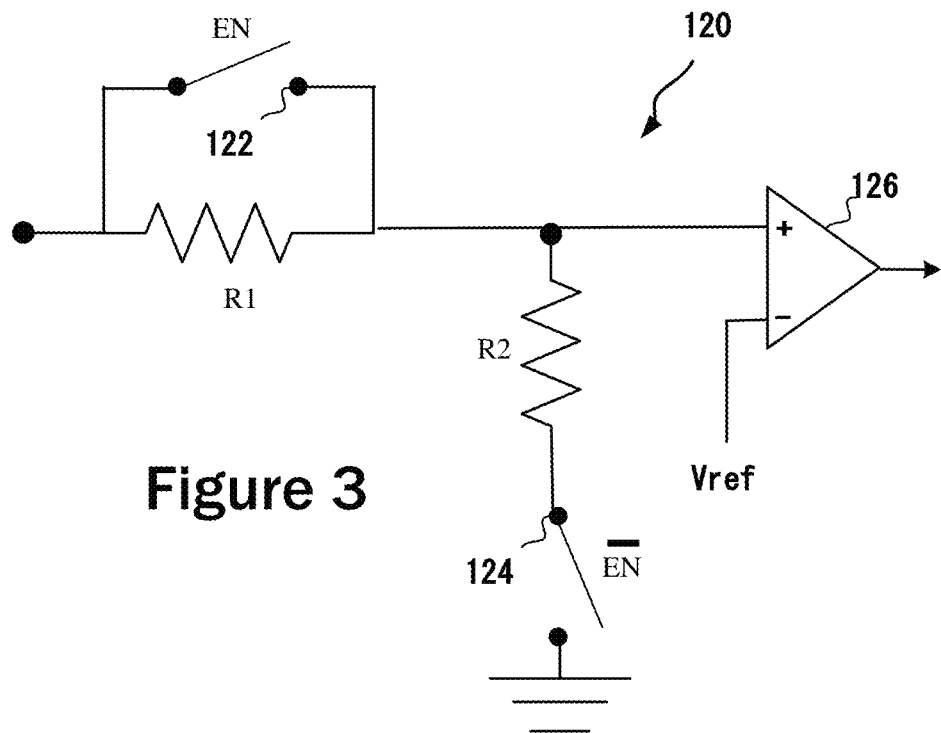
FIG. 3 shows a simplified representation of a squelch and disconnect detector in accordance with one or more embodiments.

FIG. 3 shows a simplified version of SQD and DCD circuit 120. The circuit 120 includes resistors $R_1$ and $R_2$. A bypass switch 122 is coupled with the resistor $R_1$ such that when the bypass switch is ON, the resistor $R_1$ is bypassed. A switch 124 is coupled with the resistor $R_2$. The switch 124 is configured such that when the bypass switch 122 is ON, the switch 124 is OFF. A comparator 126 is coupled with the resistors $R_1$ and $R_2$. When EN=1, the bypass switch 122 is ON (closed) and the switch 124 is OFF (open) and the input signal goes to the comparator 126 directly. Considering Vref=100 mV, any signal above 100 mV will be detected as a "Squelch Detect." When EN=0, the bypass switch 122 if OFF and the switch 124 is ON, hence the resistor divider is included between the input port and the input of the comparator 126. The resistor divider will lower the signal level by the ratio of "R2/(R1+R2)". In one example, if the values of $R_1$ and $R_2$ are selected such that the divider ratio is 1/5, the input signal above 500 mv be detected and if the signal goes below 500 mV, a loss of signal will be detected indicating a disconnect.

Figure 4:
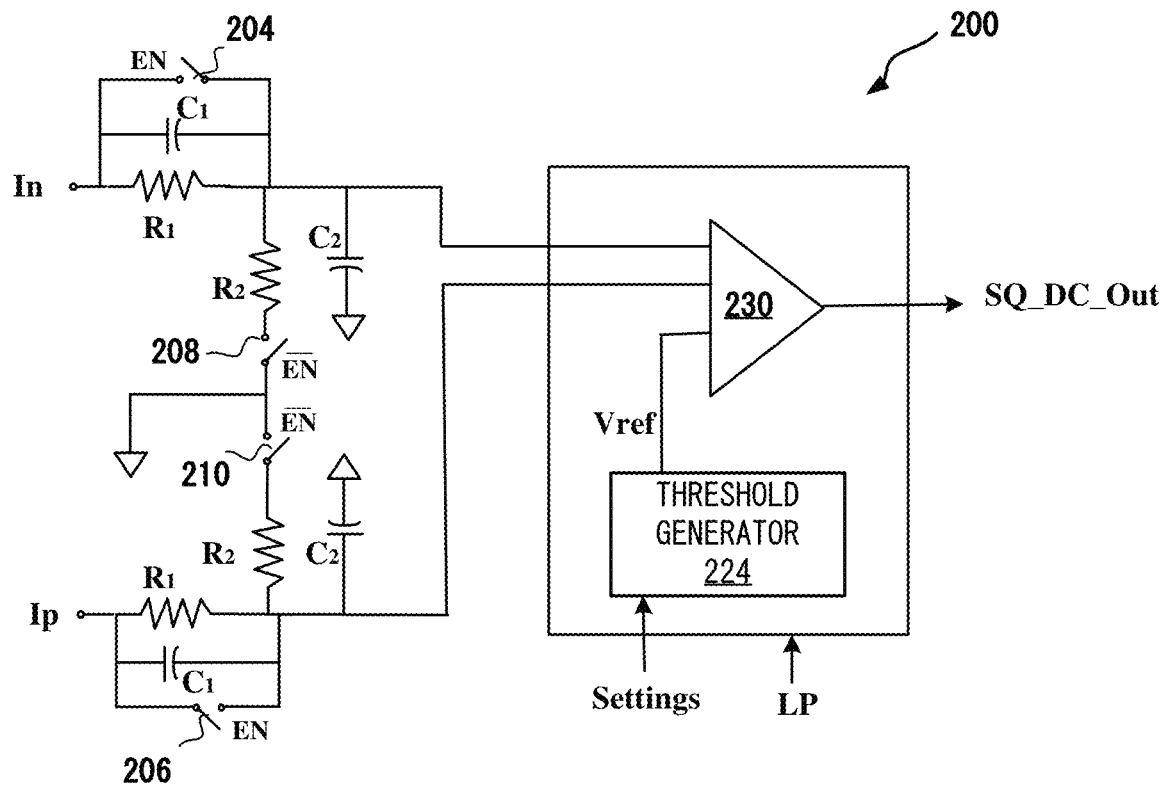
FIG. 4 shows a squelch and disconnect detector in accordance with one or more embodiments.

FIG. 4 shows a combined squelch and disconnect detector (SQD/DCD) circuit 200. The circuit 200 includes a comparator 230. The circuit 200 also includes a differential input port including inputs In and Ip. The input In is coupled to a RC network in which a resistor $R_1$ is coupled with a capacitor $C_1$ in parallel and a switch 204 is coupled to the $R_1$ and the $C_1$ in parallel such that when the switch 204 is on, the resistor $R_1$ and the capacitor $C_1$ are bypassed. The resistor $R_1$ is coupled with a resistor $R_2$ and a capacitor $C_2$. In some examples, the capacitor $C_2$ may be the input parasitic capacitance of the SQD/DCD circuit 200. The resistor $R_2$ is coupled with a switch 208 that in turn is coupled with ground. The switch 204 is driven by a signal EN and the switch 208 is driven by the inverse of the signal EN. That is, when the signal turns on the switch 204, $R_1$, $C_1$ and $R_2$ are bypassed. The input Ip is coupled to a same RC network as the input In. The input Ip side of the RC network, $R_1$, $C_1$ are coupled with a switch 206 in parallel and the input Ip side $R_2$ is coupled with the switch 210 that is driven by the inverse of the signal EN while the switch 206 is driven by the signal EN.

The SQD/DCD circuit 200 includes a enable port to receive the signal EN. The output port provides the output SQ_DC_Out. A threshold generator 224 may be included that is configured to generate a threshold according to the input settings. The threshold generator 224 may be implemented using a digital to analog converter that is calibrated to provide output amplitude based on the table 300. A LP port may be included to provide low power operations whenever slower response time can be tolerated. The SQD/DCD circuit 200 can function as a squelch detector (SQD) or as a disconnect detector (DCD) depending on the selected threshold voltage generated by the threshold generator 224. The comparator 230 may be configured to compare the differential voltage between the inputs In and Ip with Vref generated by the threshold generator 224.

Figure 5:
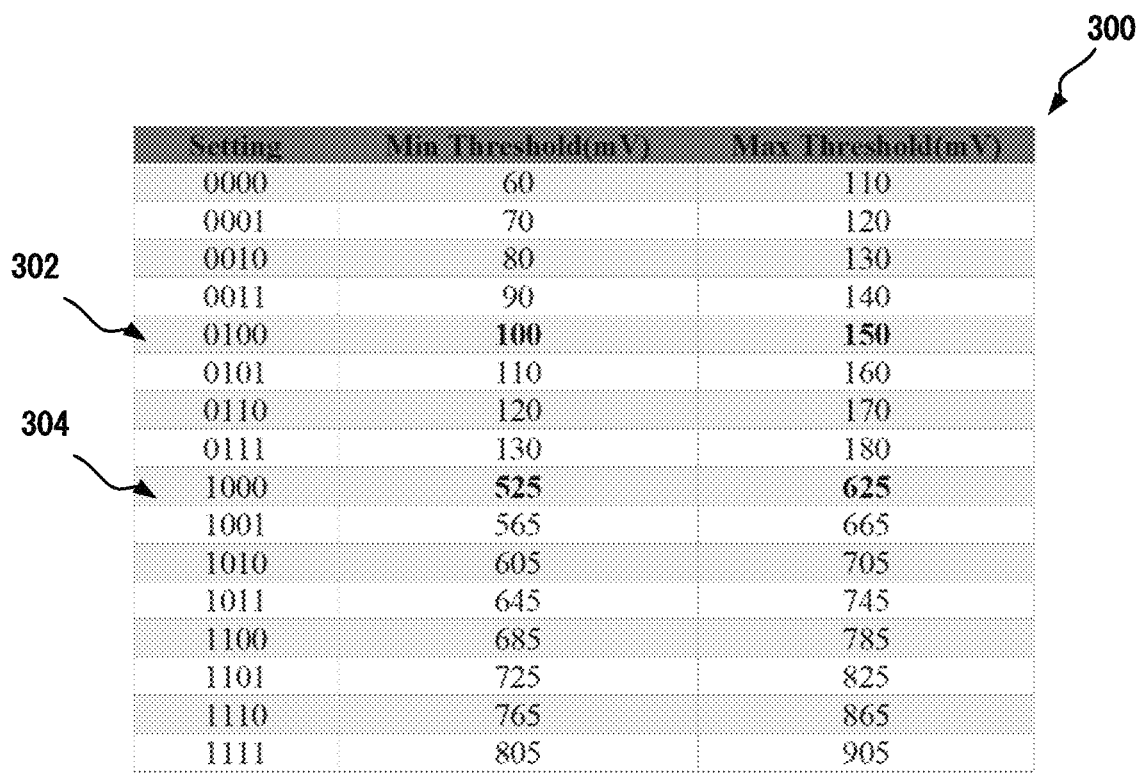
FIG. 5 shows a table of squelch and disconnect thresholds.

Briefly discussing FIG. 5 that shows a threshold voltage table 300. The table 300 may be implemented using a digital to analog converter with a input to output calibration according to the mapping table. The line 302 lists the default threshold, as specified by the USB specification, for a squelch detection. The line 304 lists the default threshold for the disconnect detector. The default threshold for the squelch detection is 100-150 mV. The default threshold for the disconnect detection is 525 to 625 mV. As evident the disconnect detection threshold is approximately five times the squelch detection threshold. Other lines in the table 300 shows other thresholds that may be used for specific applications. As indicated, the default threshold value for SDQ is 100-150 mV (125 mV) and for DCD is 525-625 mV (575 mV). Thus a programmable threshold setting will be able to cover both cases, as for example, one of the codes from 0000 to 0111 may be used for setting the squelch threshold and one of the codes from 1000 to 1111 may be used to generate disconnect threshold.

Programmable threshold makes it universal design for combining squelch detector and disconnect detector into one block. As the blocks are used mutually exclusive, this strategy can be used without impacting any USB PHY system requirements. Squelch detector is used when USB2.0 PHY is used in the receive mode and Disconnect detector is used when USB2.0 PHY is in transmit mode. Turning back to FIG. 4, each of the threshold value can be set programmatically using a the identity code in the first column of the table 300. In one example, the code can be inputted to the SQD/DCD 200 via the settings input to set appropriate thresholds.

In another example, the threshold is set by connecting or disconnecting the RC network at the input of the SQD/DCD 200. In some examples, if the threshold generator 224 is being used, the RC network may be excluded from the SQD/DCD 200. When the signal EN is high, the switch 204 and the switch 206 are on and the switches 208, 210 are off, thus $R_1$, $C_1$ and $R_2$ (e.g., the RC network) are bypassed. The comparator 230 may be configured to compare the input signal with a reference voltage Vref (125 mV in one example where default threshold is being used in an application) to provide squelch detection.

When the signal EN is low, the disconnect detector function is active and the resistor divider (with a ratio of $R_2/(R_1+R_2)=1/5$) is connected to the input of the comparator 230 to downgrade the amplitude of the input signal to 1/5th so that the comparator 230 with the same Vref (for example, 125 mV) can be used for disconnection detection. Therefore, two comparators per input (or one comparator per input with a switchable Vref), one with 125 mV reference and another with 625 mV reference are not needed (by extension, two reference voltage circuits are not needed). In some examples, the RC network is used in conjunction with the programmable thresholds, as described above, to shape the input pulse as discussed in FIG. 1 and FIG. 2. In this example, the switches that are used for connecting of disconnecting the RC network may not be included.

The control pin "LP" may be enabled during the disconnect detection mode to lower the current. The embodiments described herein may be used in USB2 repeater, eUSB2/USB2 repeater and/or USB2 host transceivers. Also any bi-directional repeater which needs to use SQD and DCD at the same node (e.g., bidirectional PCIe) may use the circuit 200 (or the circuit 120, in some embodiments).

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A circuit, comprising:
an input port, an output port, a squelch detector and a disconnect detector, wherein the squelch detector and the disconnect detector are enabled or disabled by a signal such that only one of the squelch detector and the disconnect detector is active at a given time, wherein when the squelch detector is active, a threshold generator generates a squelch threshold for the squelch detector based on a squelch configuration data indicative of a predefined squelch threshold, wherein when the disconnect detector is active, the threshold generator generates a disconnect threshold for the disconnect detector based on a disconnect configuration data indicative of a predefined disconnect threshold, the circuit further including a RC network coupled with the input port, wherein the RC network includes a first resistor R1 and a first capacitor $C_1$, a second resistor $R_2$ and a second capacitor $C_2$.

2. The circuit of claim 1, further including a mapping table to map the squelch configuration data and the disconnect configuration data and corresponding predefined thresholds.

3. The circuit of claim 1, wherein the second capacitor $C_2$ is one or both of a physical capacitor and a parasitic capacitor.

4. The circuit of claim 1, wherein the RC network is configured such that $R_1*C_1$ is substantially equal to $R_2*C_2$.

5. The circuit of claim 1, wherein the threshold generator uses a digital to analog converter that is calibrated to output a predefined voltage reference signal based on the squelch configuration data and the disconnect configuration data.

6. A universal serial bus (USB) repeater or transceiver including the circuit according to claim 1.

7. A universal serial bus (USB) to embedded USB (eUSB) repeater including the circuit according to claim 1.

8. The circuit of claim 1, wherein the squelch detector is configured to detect a presence of an input signal at the input port and the squelch detector is active during data reception at a repeater.

9. The circuit of claim 1, wherein the disconnect detector is configured to detect a disconnection of a receiver and the disconnect detector is active during data transmission from a repeater.

10. A circuit, comprising:
an input port, an output port, a squelch detector, a disconnect detector and an switchable RC network, wherein the squelch detector and the disconnect detector are enabled or disabled by a signal such that only one of the squelch detector and the disconnect detector is active at a given time, wherein when the disconnect detector is active, the switchable RC network is switched to provide a predefined ratio resistor divider between the input port and an output of the switchable RC network and when the squelch detector is active, the RC network is bypassed.

11. The circuit of claim 10, the switchable RC network is coupled with the input port, wherein the RC network includes a first resistor $R_1$ and a first capacitor $C_1$, a second resistor $R_2$ and a second capacitor $C_2$.

12. The circuit of claim 11, wherein the second capacitor $C_2$ is one or both of a physical capacitor and a parasitic capacitor.

13. The circuit of claim 11, wherein the switchable RC network includes a first switch and a second switch.

14. The circuit of claim 13, wherein the first switch and the second switch are configured to connect or bypass the resistors $R_1$, $R_2$ and the capacitor $C_1$.

15. The circuit of claim 14, wherein the first switch and the second switch are configured to bypass the resistors $R_1$, $R_2$ and the capacitor $C_1$ when the disconnect detector is inactive and the squelch detector is active.

16. The circuit of claim 10, further including a comparator coupled with the input port and a fix reference voltage equal to a default squelch threshold, wherein the comparator uses the same fix reference voltage when the squelch detector is active and when the disconnect detector is active.

17. A universal serial bus (USB) repeater or transceiver including the circuit according to claim 10.

18. A universal serial bus (USB) to embedded USB (eUSB) repeater including the circuit according to claim 10.

19. The circuit of claim 10, wherein the squelch detector is configured to detect a presence of an input signal at the input port and the squelch detector is active during data reception at a repeater and the disconnect detector is configured to detect a disconnection of a receiver and the disconnect detector is active during data transmission from a repeater.

* * * * *